(12) United States Patent
Nakayama et al.

(10) Patent No.: US 6,208,023 B1
(45) Date of Patent: Mar. 27, 2001

(54) LEAD FRAME FOR USE WITH AN RF POWERED SEMICONDUCTOR

(75) Inventors: Masao Nakayama, Osaka; Katsushi Tara, Kyoto; Isamu Yuasa, Okayama; Toshio Fujiwara, Okayama; Kaoru Muramatsu, Okayama; Noboru Yoshida, Okayama, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/126,278

(22) Filed: Jul. 30, 1998

(30) Foreign Application Priority Data

Jul. 31, 1997 (JP) ..................................................... 9-206014

(51) Int. Cl.7 ........................... H01L 23/48; H01L 23/10; H01L 23/04; H01L 23/495
(52) U.S. Cl. ........................... 257/696; 257/684; 257/666; 257/675; 257/676; 257/693; 257/692; 257/690; 257/698; 257/707; 257/730
(58) Field of Search ..................................... 257/690, 666, 257/670, 672, 675, 676, 684, 692, 693, 696, 698, 707, 716, 709, 711, 712, 720, 730

(56) References Cited

U.S. PATENT DOCUMENTS

| | | | |
|---|---|---|---|
| 5,157,475 | * 10/1992 | Yamguachi . | |
| 5,157,480 | * 10/1992 | McShane et al. | 257/693 |
| 5,172,214 | * 12/1992 | Casto | 257/676 |
| 5,521,429 | * 5/1996 | Aono et al. | 257/676 |
| 5,574,309 | * 11/1996 | Papapietro et al. | 257/679 |
| 5,783,861 | * 7/1998 | Son | 257/666 |
| 5,835,988 | * 11/1998 | Ishii | 257/684 |
| 5,859,387 | * 1/1999 | Gagnon | 257/693 |
| 5,886,397 | * 3/1999 | Ewer | 257/667 |

FOREIGN PATENT DOCUMENTS

| | | | |
|---|---|---|---|
| 62-007143 | 1/1987 | (JP) . | |
| 62-134945 | 6/1987 | (JP) . | |
| 62-138455 | 6/1987 | (JP) . | |
| 62134945 | 6/1987 | (JP) . | |
| 63-033855 | 2/1988 | (JP) . | |
| 63-059343 | 4/1988 | (JP) . | |
| 3-69248 | 7/1991 | (JP) . | |
| 03266459 | 11/1991 | (JP) . | |
| 4-309254 | * 10/1992 | (JP) | 257/696 |
| 05029529 | 5/1993 | (JP) . | |
| 05114669 | 7/1993 | (JP) . | |
| 05226532 | 9/1993 | (JP) . | |
| 5-243412 | * 9/1993 | (JP) | 257/696 |
| 06061373 | 3/1994 | (JP) . | |
| 06168988 | 6/1994 | (JP) . | |
| 07211850 | 8/1995 | (JP) . | |

* cited by examiner

*Primary Examiner*—Alexander O. Williams
(74) *Attorney, Agent, or Firm*—McDermott, Will & Emery

(57) ABSTRACT

The semiconductor device of the invention includes: a square die pad, to which a semiconductor chip is adhered via a silver paste member or the like; first leads, the inner end of each of the first leads being formed continuously and integrally with an associated shorter side of the die pad; and a pair of second leads extending in an outer direction, the inner ends of the second leads interposing the die pad therebetween. The inner end of each of the second leads includes a width-increased end portion having a larger width and being formed to be parallel to an associated longer side of the die pad. A through hole is provided in a portion connecting the width-increased end portion to the outer portion of each of the second leads. The semiconductor chip is electrically connected to the second leads via wires and to the die pad via a grounding wire.

18 Claims, 8 Drawing Sheets

LEAD FRAME FOR USE WITH AN RF POWERED SEMICONDUCTOR

BACKGROUND OF THE INVENTION

The present invention relates to a radio frequency powered semiconductor device using a surface-mounting resin-molded package and to a lead frame for the same.

Conventionally, a radio frequency semiconductor device was often assembled using a ceramic package. In recent years, however, a plastic package, molded with a molding resin material, is used more often than a ceramic package in order to reduce costs.

Hereinafter, a conventional method for fabricating a radio frequency powered semiconductor device using a lead frame for a plastic package will be described with reference to FIGS. 9(a) through 9(c).

FIG. 9(a) illustrates a planar structure during a bonding process step in the conventional method for fabricating a radio frequency powered semiconductor device. As shown in FIG. 9(a), a semiconductor chip 101 incorporating a radio frequency integrated circuit is adhered to the center portion of a square die pad 102 with a silver paste member 103. Herein, the direction along the longer sides of the die pad 102 is assumed to be X-axis direction and the direction along the shorter sides of the die pad 102 is assumed to be axis direction. A pair of grounding leads 104 are connected to both ends of the die pad 102 in the X-axis direction. A plurality of leads 105, extending in the Y-axis direction and being spaced apart from each other in the X-axis direction, are disposed to above and below the die pad 102 and to be spaced apart from the respective longer sides of the die pad 102 in the Y-axis direction. A grounding pad 101a formed on the semiconductor chip 101 for grounding the semiconductor chip 101 is electrically connected to a grounding point formed on the die pad 102 via a grounding wire 106.

FIG. 9(b) is a plan view of a semiconductor device formed by performing a step of integrally encapsulating the respective inner ends of the semiconductor chip 101, the die pad 102, the grounding leads 104 and the leads 105 with a molding resin 107 and then a bending step of molding the respective leads in predetermined shapes. FIG. 9(c) is a cross-sectional view thereof taken along the line 9C—9C of FIG. 9(b). As shown in FIG. 9(c), the grounding leads 104 are connected to a grounding land 108 such as a mounting substrate 109 and grounded. The molding resin material used as a plastic molding resin includes thermosetting epoxy resins and fillers of silica.

In the field of radio frequency powered semiconductor devices in general, it is strongly demanded to improve the heat radiation property of the molding resin 107 (i.e., to suppress the heat resistance thereof) and shorten the grounding wire 106 in order to stably operate the radio frequency powered semiconductor devices over the entire frequency regions ranging from a DC (direct current) region up to a radio frequency region.

As shown in FIG. 9(a), in the conventional radio frequency powered semiconductor device, the heat generated from the semiconductor chip 101 is conducted to the grounding land 108 (formed on the mounting substrate 109 as shown in FIG. 9(c)) through the die pad 102 and the grounding leads 104. However, in this device, the heat is conducted over a long distance from the semiconductor chip 101 to the grounding land 108 also functioning as an radiator for radiating the heat to the outside of the molding resin 107. In addition, it is difficult to secure sufficiently large grounding areas between the grounding leads 104 and the grounding land 108. Thus, this type of device cannot efficiently radiate the heat generated from the semiconductor chip 101. Accordingly, in the case of using the semiconductor chip 101 as a power converter, thermal runaway is adversely caused in the semiconductor chip 101 because the heat generated from the semiconductor chip 101 is not radiated sufficiently. As a result, the chip 101 is broken down and the reliability thereof is very low in such a case.

In a small-sized surface-mounting package, not only radiation properties but also mechanical strength thereof are problems. For example, if the thickness of the molding resin 107 is partially reduced on the bottom, on which the surface-mounting package is mounted, for the purpose of improving the radiation properties thereof, then the encapsulating strength of the molding resin 107 is disadvantageously decreased. Consequently, the leads 105 and the die pad 102 might be unintentionally detached from the molding resin 107.

Moreover, when the semiconductor chip 101 is mechanically mounted at (or die-bonded to) a predetermined position on the die pad 102 as shown in FIG. 9(a), positional misalignment of about 0.1 mm to about 0.5 mm is likely to be caused between the predetermined position and the actually mounted position of the semiconductor chip 101 on the die pad 102 in each of the X- and Y-axis directions. If such positional misalignment is caused in mounting the semiconductor chip 101, a mounting margin of about 0.5 mm to about 1 mm should be provided in the Y-axis direction for the grounding point 102a to be located with respect to the longer side of the semiconductor chip 101 when the bonding pad 101a on the semiconductor chip 101 is connected to the grounding point 102a on the die pad 102 via the grounding wire 106. Thus, the length of the grounding wire 106 becomes longer by the mounting margin. Accordingly, in the case of operating the semiconductor chip 101 as a power converter over a wide frequency region ranging from DC to radio frequency, oscillation adversely results from the parasitic inductance of the grounding wire 106 and the chip 101 cannot be operated stably any more.

Furthermore, when the bonding pad 101a is connected to the grounding point 102a via the grounding wire 106 in the same way after the semiconductor chip 101 has been adhered at the predetermined position of the die pad 102 with an adhesive such as the silver paste member 103, a certain distance should be provided between the longer side of the semiconductor chip 101 and the grounding point 102a on the die pad 102, considering the expansion of the silver paste member 103 to the periphery of the semiconductor chip 101. In such a case, the length of the grounding wire 106 also needs some margin.

Moreover, in the bending step, the grounding leads 104 and the leads 105 are appropriately bent such that the bottoms of the grounding leads 104 and the leads 105 are located at substantially the same level as that of the bottom of the molding resin 107 when the packaged semiconductor device is mounted onto the mounting substrate. In this bending step, the extended portion of any of the grounding leads 104 and the leads 105 should have a length of about 2 mm to about 15 mm from the corresponding side of the molding resin 107, from which the lead 104 or 105 extends. Thus, since none of these leads 104 and 105 can have a shortened length, the mounting area of the semiconductor device cannot be reduced.

SUMMARY OF THE INVENTION

In view of these conventional problems, the present invention was made to accomplish the objects of stably operating a radio frequency powered semiconductor device over a wide frequency region ranging from a DC region to a radio frequency region and reducing the mounting area of the radio frequency powered semiconductor device.

In order to accomplish these objects, according to the present invention, at least part of the bottom of a die pad for mounting a semiconductor element thereon and at least part of the bottom of a lead are exposed on the bottom of a molding resin as a package and the exposed bottom part of the die pad is made substantially flush with the exposed bottom part of the lead on the bottom of the molding resin.

A first semiconductor device according to the present invention includes: a die pad; a semiconductor element mounted on the die pad; a first lead having an inner end connected to the die pad; a second lead having an inner end electrically connected to the semiconductor element via a wire; and a molding resin integrally encapsulating the die pad, the semiconductor element, an inner portion of the first lead and an inner portion of the second lead. At least part of the bottom of the die pad is exposed on the bottom of the molding resin. At least part of the bottom of the first lead is exposed on the bottom of the molding resin. At least part of the bottom of the second lead is exposed on the bottom of the molding resin. The exposed part of the die pad is substantially flush with the exposed part of the second lead.

In the first semiconductor device, at least part of the bottom of the die pad is exposed on the bottom of the molding resin and the exposed part of the die pad is substantially flush with the exposed part of the second lead. Thus, when the bottom of the molding resin is mounted on a mounting substrate, the die pad comes into direct contact with the surface of the substrate and therefore, the heat generated from the semiconductor element is directly conducted from the die pad to the substrate. As a result, the heat conduction distance from the semiconductor element to the mounting substrate is shortened. In other words, since the radiation properties thereof can be improved, it is possible to stably operate the semiconductor element on the die pad without thermally damaging the semiconductor element. Moreover, if the first lead is a grounding lead, the parasitic inductance of the first lead can be considerably reduced. Consequently, it is possible to stably operate the semiconductor element even in a radio frequency region.

In addition, at least part of the bottom of the first lead and at least part of the bottom of the second lead are exposed on the bottom of the molding resin and the exposed part of the die pad is substantially flush with the exposed part of the second lead. Thus, when the bottom of the molding resin is mounted on the mounting substrate, electrical connection can be established on the plane where the upper surface of the mounting substrate and the bottom of the molding resin are in contact with each other. As a result, the mounting area can be substantially reduced. Furthermore, since no bending process is required for the second lead, the assembly process of the semiconductor device can be simplified.

In the first semiconductor device, the die pad preferably includes thickness-reduced side portions protruding substantially in parallel to a mounting plane of the die pad, and the thickness-reduced side portions are preferably covered with the molding resin.

In such an embodiment, even if the bottom of the first lead and the bottom of the die pad are entirely exposed on the bottom of the molding resin, it is possible to prevent the first lead and the die pad from peeling off the molding resin.

In the first semiconductor device, the thickness-reduced side portions are preferably formed by rolling sides of the die pad.

In such an embodiment, it is possible to ensure satisfactory flatness for the thickness-reduced side portions on the mounting plane of the die pad.

In the first semiconductor device, the inner portion of the second lead preferably includes a bent portion for locating the bottom of the inner end of the second lead at substantially the same level as the level of the bottom of the thickness-reduced side portions when the levels are measured from the bottom of the molding resin.

In such an embodiment, if the first lead, the second lead and the die pad are molded by using a molding die, these portions can be processed during the same process. In addition, since a guiding jig for supporting the second lead can be inserted under the bottom of the inner end of the second lead and the bottom of the thickness-reduced side portions during wire bonding, the wire-bonding accuracy can be improved Moreover, even when the bottom of the second lead is exposed on the periphery of the bottom of the molding resin, the second lead is less likely to peel off the molding resin, because the bottom of the bent portion of the second lead is covered with the molding resin.

In the first semiconductor device, the bottom of the inner end of the second lead is preferably located at a level higher than the level of the mounting plane of the die pad when the levels are measured from the bottom of the molding resin.

In such an embodiment, since the gap between the bottom of the bent portion of the second lead and the bottom of the molding resin is increased and the amount of the molding resin material to be filled in the gap is also increased, the second lead is even less likely to peel off the molding resin.

In the first semiconductor device, a thickness of the molding resin covering the upper surface of the inner end of the second lead is preferably larger than a thickness of the molding resin covering the bottom of the inner end of the second lead.

In such an embodiment, sufficient strength is ensured for the molding resin as a package.

In the first semiconductor device, a through hole penetrating the second lead is preferably provided for the bent portion.

In such an embodiment, since the molding resin is filled in the through hole, the molding resin covering the bottom of the inner portion of the second lead is integrated with the molding resin covering the upper surface of the inner portion of the second lead. Thus, the second lead is even less likely to peel off the molding resin.

In the first semiconductor device, the second lead preferably includes at least two leads provided to be spaced apart from the sides of the die pad and to interpose the die pad therebetween. At least one of the two second leads preferably includes, at the inner end, a width-increased end portion having a larger width than the width of the other portion.

In such an embodiment, the number of wires for electrically connecting the second leads to the semiconductor element on the die pad can be increased. In addition, since the width-increased end portion and the semiconductor element can be connected over a shortest distance therebetween, the length of each wire can be shortened. Thus, the wiring resistance and inductance of the wires can be reduced and the tensile strength of the lead can be increased. As a result, the operational stability and mechanical strength of the semiconductor element can be improved.

In the first semiconductor device, the grain diameter of fillers contained in the molding resin is preferably 100 $\mu$m or less.

In such an embodiment, it's highly probable that the molding resin material is filled in the through hole formed in the bent portion of the second lead, and therefore the molding resin material can be uniformly filled within the package. As a result, the mechanical strength of the semiconductor device can be improved.

In the first semiconductor device, the width of the mounting plane of the die pad is preferably larger than the width of the bottom of the die pad.

In such an embodiment, even if the thickness-reduced side portions are not formed, the sides of the die pad form a taper like cross section with gradually decreasing widths from the upper surface toward the bottom, and are covered with the molding resin. Thus, it is possible to prevent the die pad from peeling off the molding resin.

In the first semiconductor device, the upper surface of the semiconductor element is preferably located at substantially the same level as the level of the upper surface of the inner end of the second lead when the levels are measured from the bottom of the molding resin.

In such an embodiment, in wire-bonding a bonding pad formed on the upper surface of the semiconductor element to the upper surface of the inner end of the second lead, the length of the wires can be shortened, and therefore the wiring resistance and parasitic inductance of the wires can be reduced. As a result, it is possible to stabilize the operation of the semiconductor element.

In the first semiconductor device, the first lead preferably includes two leads extending from one end and the other end of the die pad, respectively, and the second lead preferably includes a pair of leads provided to be spaced apart from the sides of the die pad and to interpose the die pad therebetween.

In such an embodiment, if one of the pair of second leads is used as an input terminal and the other is used as an output terminal, the bonding pad formed on the upper surface of the semiconductor element can be connected with certainty to the upper surface of the inner end of each second lead.

In the first semiconductor device, the die pad preferably includes a convex portion on the periphery of the mounting plane, the convex portion protruding substantially vertically to the mounting plane.

In such an embodiment, since the mounting position of the semiconductor element on the mounting plane can be regulated, a smaller mounting margin may be provided for the mounting position, and therefore the length of the wires can be shortened. Moreover, if the bonding pad formed on the upper surface of the semiconductor element is connected to the upper surface of the convex portion formed on the periphery of the mounting plane of the die pad via a wire, the length of the wire can be further shortened.

In the first semiconductor device, the upper surface of the convex portion of the die pad is preferably located at substantially the same level as the level of the upper surface of the semiconductor element when the levels are measured from the bottom of the molding resin.

In such an embodiment, the length of the wire for electrically connecting the bonding pad formed on the upper surface of the semiconductor element to the upper surface of the convex portion formed on the periphery of the mounting plane of the die pad can be shortened with certainty.

In the first semiconductor device, the upper surface of the convex portion of the die pad is preferably located at substantially the same level as the level of the upper surface of the inner end of the second lead when the levels are measured from the bottom of the molding resin.

In such an embodiment, in connecting the bonding pad formed on the upper surface of the semiconductor element to the inner end of the second lead via a wire, it is possible to prevent the wire from coming into contact with the convex portion formed on the periphery of the mounting plane. As a result, reliability is ensured during assembly.

In the first semiconductor device, at least two semiconductor elements are preferably mounted on the die pad, and a concave portion or a convex portion is preferably provided for the mounting plane of the die pad between adjacent ones of the semiconductor elements.

In such an embodiment, during die bonding, the concave portion or the convex portion provided between adjacent ones of the semiconductor elements prevents an adhesive from diffusing over the mounting plane of the die pad. Thus, in mounting each semiconductor element onto the die pad, the mounting margin on the mounting plane of the die pad can be reduced, and as a result, two or more semiconductor elements can be mounted to be closer to each other. Consequently, in electrically connecting the semiconductor elements to each other via wires, the length of the wires can be shortened.

In the first semiconductor device, the first lead preferably includes concave side portions or convex side portions, and the bottom of the first lead is preferably entirely exposed on the bottom of the molding resin.

In such an embodiment, even when the bottom of the first lead is entirely exposed on the bottom of the molding resin, the first lead is less likely to peel off the molding resin. In addition, since the mounting surface (i.e., bottom) of the first lead is entirely exposed on the mounting plane of the molding resin, adhesive such as solder can easily expand uniformly in mounting the die to a substrate or the like. As a result, satisfactory electrical and mechanical mounting is realized.

In the first semiconductor device, the concave portions or the convex portions are preferably formed at respective positions asymmetrical with respect to the center of the bottom of the molding resin.

In such an embodiment, the concave portions or the convex portions can be used as indices for defining reference pins among a plurality of lead pins. As a result, a process step of providing such indices for the molding resin can be simplified.

In the first semiconductor device, the inner portion of the first lead preferably includes a curved portion curving from the bottom toward the upper surface of the inner portion of the first lead, and the molding material is preferably filled inside the curved portion.

In such an embodiment, the strength of the first lead can be increased. In addition, even when the bottom of the first lead is exposed on the bottom of the molding resin, it is possible to prevent the first lead from peeling off the molding resin with certainty, because the molding resin material filled inside the curved portion is integrated with the molding resin material located outside of the curved portion.

In the first semiconductor device, the molding resin preferably includes a concave portion, and the bottom of the concave portion is preferably divided into a mirror surface portion and a non-mirror surface portion so as to correspond to the first lead and the second lead.

In such an embodiment, since the mirror surface portion and the non-mirror surface portion of the concave portion can be used as indices for defining the reference pins among a plurality of lead pins, the process step of providing indices for the molding resin can be simplified.

A second semiconductor device according to the present invention includes: a die pad; a semiconductor element mounted on the die pad; a first lead connected to the die pad; and at least two second leads provided so as to be spaced apart from the sides of the die pad and to interpose the die pad therebetween. The die pad and the first and second leads are integrally encapsulated with a molding resin material such that the bottoms of the die pad and the first and second leads are flush with each other at least partially. The upper surface of the inner end of the second lead is located higher than the upper surface of the die pad. The die pad includes expanding side portions on the upper surface of the die pad, the expanding side portions expanding from the sides of the die pad facing the second leads. The molding resin material is also filled in a region between the inner end of each said second lead and an associated one of the expanding side portions, a region underlying the inner end of each said second lead and a region underlying each said expanding side portion.

In the second semiconductor device, the die pad and the first and second leads are integrally encapsulated with a molding resin material such that the bottoms of the die pad and the first and second leads are flush with each other at least partially, and the molding resin material is also filled in a region between the inner end of each said second lead and an associated one of the expanding side portions, a region underlying the inner end of each said second lead and a region underlying each said expanding side portion. Thus, even in a surface-mounting type semiconductor device, the die pad and the first and second leads are less likely to peel off the package made of the molding resin material, and therefore the strength of the package can be increased.

In the second semiconductor device, at least one of the second leads preferably includes a width-increased end portion at the inner end. The width-increased end portion preferably extends along the sides of the die pad and has a width substantially equal to or longer than the length of the semiconductor element as measured along the second leads.

In the second semiconductor device, the width-increased end portion of the second lead and the semiconductor element are preferably electrically connected to each other via at least two wires. The wires preferably have a substantially equal length and are substantially parallel to each other.

In such an embodiment, since the electrical characteristics of the wires can be matched, the semiconductor device can be operated stably even in a radio frequency region.

In the second semiconductor device, the die pad preferably includes wire connecting portions at respective positions, facing the second lead, on the upper surface of the die pad. The wire connecting portions electrically connect the die pad to the semiconductor element.

In such an embodiment, since the die pad is connected to the first lead, the first lead may be used as a grounding lead, for example.

In the second semiconductor device, the wire connecting portions are preferably the expanding side portions.

In such an embodiment, since the area of the mounting plane of the die pad is enlarged by the expanding side portions, the die pad can be wire-bonded with the semiconductor element on the die pad with more certainty.

A lead frame for semiconductor device according to the present invention includes: a die pad; a first lead having an inner end integrally formed with the die pad; and at least two second leads provided so as to interpose the die pad therebetween, the inner ends of the second leads being spaced apart from the die pad. The die pad includes thickness-reduced side portions expanding substantially in parallel to a mounting plane of the die pad on which the semiconductor element is mounted. An inner portion of each said second lead includes a bent portion bending the inner end of the second lead from the bottom toward the upper surface of the inner end. At least part of the bottom of the die pad is substantially flush with at least part of the bottom of each said second lead.

In the lead frame for semiconductor device in accordance with the present invention, at least part of the bottom of the die pad is substantially flush with at least part of the bottom of the second lead. Thus, when the die pad, the semiconductor element secured to the die pad and the first and second leads are integrally encapsulated with a molding resin, at least part of the bottom of the die pad is exposed on the bottom of the molding resin. In addition, at least part of the bottom of the second lead is also exposed on the periphery on the bottom of the molding resin so as to be substantially flush with the bottom of the die pad. Therefore, the heat generated from the semiconductor element is directly conducted from the die pad to the mounting substrate. As a result, the heat conduction distance is shortened. In other words, since the radiation properties thereof can be improved, it is possible to stably operate the semiconductor element mounted on the die pad without thermally damaging the semiconductor element. Moreover, if the first lead is used as a grounding lead, the parasitic inductance of the first lead can be considerably reduced. Consequently, it is possible to stably operate the semiconductor element even in a radio frequency region.

In addition, since the inner portion of the second lead can be electrically connected on the contact plane between the mounting substrate and the molding resin, the length of the lead on the periphery of the molding resin can be shortened. As a result, the mounting area can be reduced.

Moreover, since the thickness-reduced side portions formed on the sides of the die pad are covered with the molding resin, it is possible to prevent the die pad from peeling off the molding resin, even if the bottom of the die pad is exposed on the bottom of the molding resin.

Furthermore, since a bent portion is formed in the inner portion of the second lead, the bottom of the inner portion of the second lead is covered with the molding resin. Thus, even when the bottom of the second lead is exposed on the periphery on the bottom of the molding resin, the second lead is less likely to peel off the molding resin, because the bottom of the bent portion of the second lead is covered with the molding resin.

Moreover, the upper surface of the semiconductor element on the die pad comes closer to the upper surface of the inner end of the second lead by providing the bent portion. Thus, in wire-bonding a bonding pad formed on the upper surface of the semiconductor element to the upper surface of the inner end of the second lead, the length of the wires can be shortened, and therefore the wiring resistance and parasitic inductance of the wires can be reduced. As a result, it is possible to stabilize the operation of the semiconductor element.

In addition, since at least part of the bottom of the die pad is substantially flush with at least part of the bottom of the second lead, a bending process step, which has conventionally been performed on the leads after resin molding, is no longer necessary. As a result, the manufacturing process can be simplified.

BRIEF DESCRIPTION OF THE DRAWINGS

FIG. 1(a) is a plan view; FIG. 1(b) is a cross-sectional view taken along the line 1B—1B of FIG. 1(a); and FIG. 1(c) is a bottom view thereof.

FIG. 2(a) is a cross-sectional view thereof; and FIG. 2(b) is a cross-sectional view showing a die pad.

FIG. 3(a) is a plan view showing a die pad; and FIG. 3(b) is a cross-sectional view taken along the line 3B—3B of FIG. 3(a).

FIG. 4(a) is a plan view showing a die pad; and FIG. 4(b) is a cross-sectional view taken along the line 4B—4B of FIG. 4(a).

FIG. 4(c) is a plan view showing a die pad; and FIG. 4(d) is a cross-sectional view taken along the line 4D—4D of FIG. 4(c).

FIG. 6(a) is a bottom view; and FIG. 6(b) is a cross-sectional view taken along the line 6B—6B of FIG. 6(a).

FIG. 9(a) is a plan view before encapsulating; FIG. 9(b) is a plan view after encapsulating; and FIG. 9(c) is a cross-sectional view taken along the line 9C—9C of FIG. 9B.

DETAILED DESCRIPTION OF THE INVENTION

Embodiment 1

Hereinafter, the first embodiment of the present invention will be described with reference to the drawings.

Figure 1A:
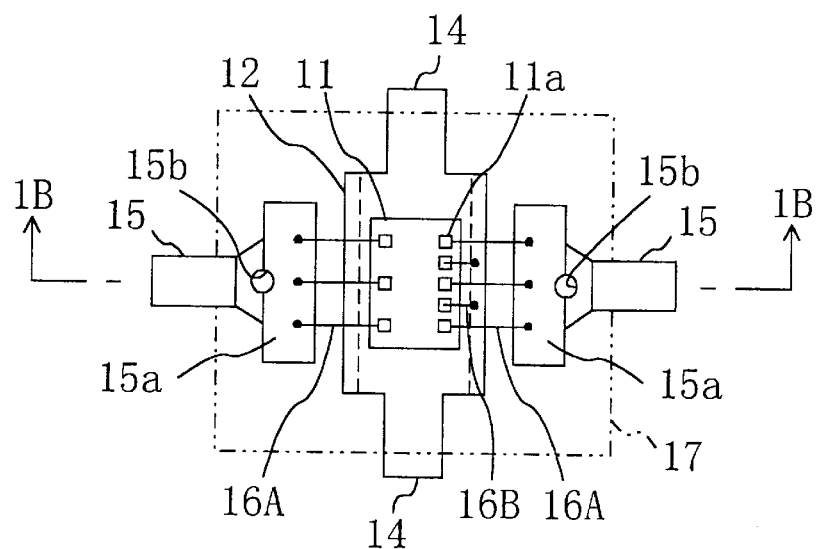
FIGS. 1(a) through 1(c) illustrate a semiconductor device in the first embodiment of the present invention.
Figure 1B:
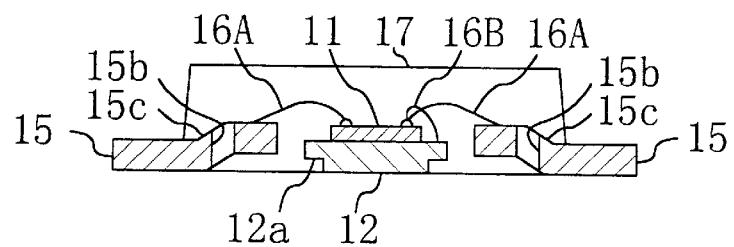
Figure 1C:
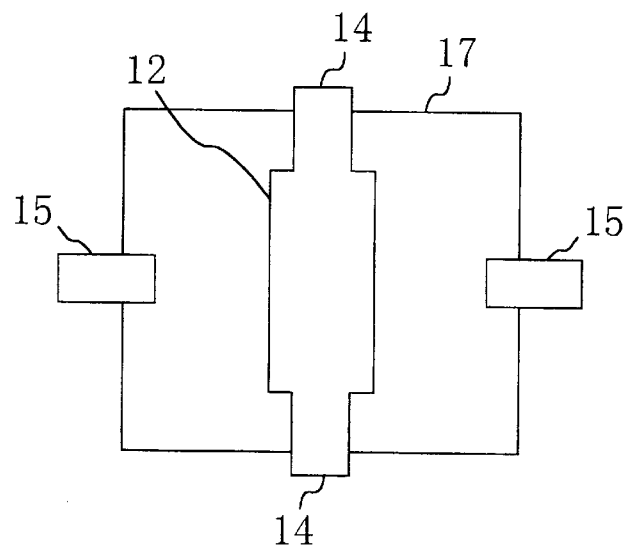

FIGS. 1(a) through 1(c) illustrate a semiconductor device in the first embodiment of the present invention. FIG. 1(a) illustrates a planar structure of the semiconductor device. FIG. 1(b) illustrates a cross-sectional structure thereof taken along the line 1B—1B of FIG. 1(a). FIG. 1(c) illustrates a planar structure of the bottom thereof, i.e., the surface of the semiconductor device to be mounted onto a substrate or the like.

As shown in FIG. 1(a), the semiconductor device includes: a semiconductor chip 11 as a semiconductor element in which a radio frequency integrated circuit is formed; a square die pad 12 having an upper surface on which the semiconductor chip 11 is mounted; first leads 14, each having an inner end formed to be continuous and integrated with the end of an associated shorter side of the die pad 12; and a pair of second leads 15 having inner ends formed to be spaced apart from the die pad 12 and to interpose the die pad therebetween and extending outward. As for the mounting plane of the die pad 12 for the semiconductor chip 11, the width of the shorter sides of the mounting plane is adjusted to be larger than the width of the first leads 14 by selectively coining or bending the sides of the first leads 14.

The inner end of each of the second leads 15 is formed to have an increased width and face the end of an associated longer side of the die pad 12. In other words, each second lead 15 includes a width-increased end portion 15a having a width substantially equal to or larger than the length of the longer sides of the semiconductor chip 11. In the portion connecting each width-increased end portion 15a to the other portion of the associated second lead 15, a through hole 15b penetrating the second lead 15 from the upper surface until the bottom thereof is formed.

The semiconductor chip 11 is electrically connected to the second leads 15 via wires 16A and is also electrically connected to an expanding portion of the die pad 12 via grounding wires 16B. In this embodiment, the expanding portions of the die pad 12 are formed so as to face the second leads 15 and one of the portions is used as a wire connecting portion.

In FIGS. 1(a) and 1(b), the width-increased end portion 15a is provided for the inner end of each of the pair of second leads 15. Alternatively, the width-increased end portion 15a may be provided for the inner end of either one of the leads 15.

Also, in this embodiment, the second leads 15 are disposed so as to face each other via the die pad 12 therebetween. However, the leads 15 do not necessarily face each other. Nevertheless, if the leads 15 face each other, the retention force of the molding resin material is stronger than not.

Furthermore, in this embodiment, the number of the second leads 15 is only two. Alternatively, depending on the size of the semiconductor chip 11 or the type of the circuit incorporated therein, the number of the second leads 15 may be increased. In such a case, the number of the second leads 15 disposed on one side of the die pad 12 does not always have to be equal to the number of the second leads 15 disposed on the other side of the die pad 12.

As shown in FIG. 1(b), a bent portion 15c bent upward (i.e., rising from the bottom toward the upper surface) is provided for the portion connecting the width-increased end portion 15a to the other portion of the second lead 15. In addition, thickness-reduced side portions 12a (i.e., expanding portions protruding substantially in parallel to the mounting plane) are provided on both ends of the longer sides of the die pad 12. The die pad 12, the semiconductor chip 11 mounted on the die pad 12, the inner portion of each of the first leads 14 and the inner portion of each of the second leads 15 are integrally encapsulated with a molding resin 17.

As shown in the bottom view of the semiconductor device illustrated in FIG. 1(c), the bottom of the die pad 12 and the bottom of each of the first leads 14 connected to the die pad 12 are entirely exposed on the bottom of the molding resin 17. On the other hand, since the second lead 15 includes the bent portion 15c, the bottom of the second lead 15 is exposed only partially around the periphery on the bottom of the molding resin 17. Furthermore, the bottom of the die pad 12 and the bottoms of the inner ends of the first and second leads 14, 15 are formed to make a single plane, i.e., to be substantially flush, with the bottom of the molding resin 17. Herein, the "single plane" refers to a plane needed for surface-mounting a semiconductor device.

As can be understood, in this embodiment, the bottom of the die pad 12 and the bottoms of the first leads 14 connected to the die pad 12 are entirely exposed on the bottom of the molding resin 17. In addition, the bottoms of the second leads 15 are exposed only partially on the periphery and the outer vicinity of the bottom of the molding resin 17. Thus, if mounting is performed such that the bottom of the die pad 12 and the bottoms of the inner ends of the first leads 14 come into contact with a grounding land (not shown) of a mounting substrate, then the heat generated from the semiconductor chip 11 is directly conducted from the die pad 12 and the first leads 14 to the grounding land. As a result, the radiation effects can be considerably improved, and the parasitic inductance can be significantly reduced in a path from the semiconductor chip 11 to the grounding land. Consequently, the radio frequency integrated circuit incorporated in the semiconductor chip 11 can be operated stably over a wide frequency region ranging from DC to radio frequency without receiving any thermal damage.

In addition, since the respective bottoms of the die pad 12, the first leads 14 and the second leads 15 are exposed on the bottom of the molding resin 17, electrical connection is established with the mounting substrate on the bottom of the molding resin 17. Thus, the mounting area of the semiconductor device can be reduced. Moreover, in mounting the semiconductor device to the mounting substrate by using an adhesive such as solder, the adhesive is more likely to expand uniformly on the bottom of the molding resin 17. As a result, the semiconductor device is electrically connected to the substrate with more certainty and the mechanical strength of the semiconductor device is increased.

Moreover, the bottom of the die pad 12 and the bottoms of the respective inner ends of the first and second leads 14, 15 are all formed to make a single plane with the bottom of the molding resin 17. Thus, since a bending process step, which is conventionally performed on the first and second leads 14, 15 after resin molding, is no longer necessary, the assembly process of the semiconductor device can be simplified.

In addition, the molding resin material is also filled in the regions underlying the respective thickness-reduced side portions 12a of the die pad 12. Thus, even when the bottom of the die pad 12 and the bottoms of the first leads 14 are exposed, the die pad 12 and the first leads 14 are less likely to peel off the molding resin. In this embodiment, the thickness-reduced side portions 12a of the die pad 12 are formed by rolling. Thus, the thickness-reduced side portion 12a can be formed easily and with certainty without folding the die pad 12. As a result, the mounting plane can be made sufficiently wide and flat. If this rolling process step is performed simultaneously with the folding process step for the second leads 15 by using the same folding mold for forming the bent portion 15c in each of the second leads 15, then the manufacturing process can also be simplified. Also, if the thickness-reduced side portions 12a are provided for not only the die pad 12 but also both ends of the first leads 14, the strength of the semiconductor device can be further enhanced.

The thickness of the thickness-reduced side portions 12a is preferably about 20% to about 90% of the body of the die pad 12. Therefore, the height of the bottom of the thickness-reduced side portions 12a as measured from the bottom of the body of the die pad 12 is about 10% to about 80% of the thickness of the body of the die pad 12.

The length of the thickness-reduced side portion 12a expanding toward the associated second lead 15 is preferably in the range of about 1 to about 4 times as long as the height of the bottom of the thickness-reduced side portion 12a as measured from the bottom of the body of the die pad 12. Then, it is possible to prevent the die pad 12 from being peeling off the molding resin 17 with certainty. In addition, since the mounting plane of the die pad 12 is expanded, pads for connecting wires thereto can be provided in the bonding portions located on the periphery of the mounting plane with certainty.

Also, instead of providing the thickness-reduced side portions 12a therefor, the die pad 12 may have a cross section in an inverted trapezoidal shape (i.e., the upper side is longer than the base) in the direction vertical to the direction in which the first leads 14 extend. In such a case, the width of the bottom of the die pad 12 becomes shorter than the width of the mounting plane thereof. Thus, the molding resin material is filled in under both sides of a taper gradually decreasing the width downward. Accordingly, even when the bottom of the die pad 12 is exposed on the bottom of the molding resin 17, the molding resin material filled under both sides of the die pad 12 can prevent the die pad 12 from peeling off the molding resin 17. Herein, if the cross section is an inverted trapezoid having a base absolutely smaller than the upper side thereof (in an extreme case, an inverted triangle), the sides of the taper may be regarded as part of the bottom. It is noted that in order to form such an inverted trapezoid, coining may be performed in the same way as in the case of the thickness-reduced side portions 12a of the die pad 12.

On the other hand, since the bent portion 15c is provided for the inner portion of each second lead 15, the molding resin material of the molding resin 17 is filled in under the inner end of the second lead 15. Thus, even when the bottom of the second lead 15 is exposed on the bottom of the molding resin 17, the second lead 15 is very less likely to peel off the molding resin 17. In addition, since the bent portion 15c is provided, the upper surface of the semiconductor chip 11 mounted on the die pad 12 is located at a substantially equal level to that of the upper surface of the second lead 15 as measured from the bottom of the molding resin 17. Thus, since the distance between the bonding pads 11a formed on the upper surface of the semiconductor chip 11 and the associated second lead 15 is shortened, the length of the wires 16A connecting the bonding pads 11a to the second lead 15 can also be shortened.

Moreover, since the width-increased end portion 15a is formed in the inner end of each second lead 15, the area reserved for disposing the wires 16A connecting the second lead 15 to the semiconductor chip 11 is enlarged. Thus, the number of the wires 16A can be increased. As a result, the wiring resistance and the parasitic inductance of the wires 16A can be reduced and the tensile strength of the lead itself can be increased.

It is noted that the level difference between the upper surfaces of the inner and outer ends of the second lead 15 is preferably about 20% to about 100% of the thickness of the second lead 15.

Moreover, assume the bottom of the inner end of the second lead 15 is located at the same height as that of the bottom of the thickness-reduced side portion 12a of the die pad 12. Then, during the bending process step of the second leads 15 and the die pad 12 or during connecting the bonding pads IIa of the semiconductor chip 11 to the second leads 15 via the wires 16A, a guiding jig, made of a metal and having a flat surface, for example, may be inserted to come into contact with both the bottoms of the width-increased end portions 15a of the second leads 15 and those of the thickness-reduced side portions 12a. Thus, the distortion or deformation, which sometimes occurs on the wire-bonding surfaces of the second leads 15 and the die pad 12, can be reduced. As a result, the wire-bonding accuracy can be improved.

Also, the thickness of the molding resin material filled in the gap between the upper surface of the molding resin 17 and the upper surface of the width-increased end portion 15a of the second lead 15 is preferably three times or more as large as the thickness of the molding resin material filled in the gap between the bottom of the molding resin 17 and the bottom of the width-increased end portion 15a of the second lead 15. Then, sufficient strength can be ensured for the molding resin 17 as a package.

Furthermore, since the second lead 15 includes the through hole 15b penetrating the second lead 15 in the portion connected to the width-increased end portion 15a, a sufficient amount of molding resin material of the molding resin 17 is filled in the region under the bottom of the width-increased end portion 15a. It is noted that the grain diameter of the fillers contained in the molding resin material is preferably 100 $\mu$m or less so as to uniformly fill the molding resin material within the package.

In this embodiment, the planar shape of the die pad 12 is regarded as square (rectangular, in particular). However, the shape is not limited thereto, but may be a desired shape in view of the shapes of the semiconductor chip 11 to be mounted, the second leads 15 and/or the molding resin 17.

Embodiment 2

Hereinafter, the second embodiment of the present invention will be described with reference to the drawings.

Figure 2A:
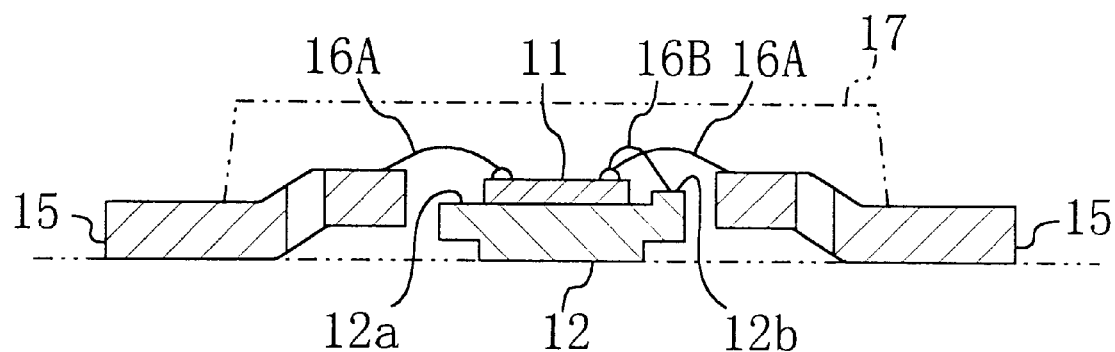
FIGS. 2(a) and 2(b) illustrate a semiconductor device in the second embodiment of the present invention.
Figure 2B:
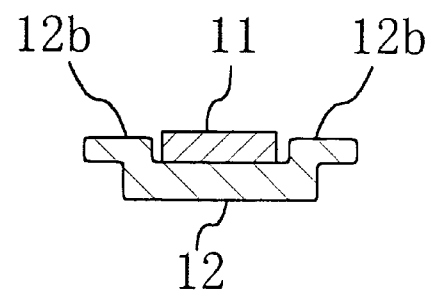

FIGS. 2(a) and 2(b) illustrate a semiconductor device in the second embodiment of the present invention. FIG. 2(a) illustrates a cross-sectional structure of the semiconductor device and FIG. 2(b) illustrates a cross-sectional structure of the die pad only. In the same way as in FIG. 1(b), FIG. 2(a) illustrates a cross-sectional structure in a direction vertical to the direction in which the die pad is connected to the first leads (not shown) and in which the first leads extend. In FIG. 2(a), the same components as those shown in FIG. 1(b) are identified by the same reference numerals and the description thereof will be omitted herein. In this embodiment, the die pad 12 includes thickness-reduced side portions 12a on right and left sides of the mounting plane. More specifically, one of the thickness-reduced side portions 12a is a chip position regulating portion 12b, which has a thickness of about 5% to about 100% of the thickness of the semiconductor chip 11 and protrudes substantially vertically to the mounting plane. The chip position regulating portion 12b can also be molded by coining or bending in the same way as in the first embodiment and can be formed during the same process as that of the thickness-reduced side portion 12a of the die pad 12. Thus, it is not necessary to perform an additional process.

As can be understood, since the chip position regulating portion 12b is provided so as to protrude substantially vertically to the mounting plane of the die pad 12, the position on the mounting plane of the die pad 12, at which the semiconductor chip 11 is mounted, can be regulated during the die bonding process. Thus, the mounting margin of the mounting position can be reduced. As a result, the length of the wires to be bonded during the wire-bonding process can be shortened in accordance with the decrease in mounting margin.

In addition, since the distance between the bonding pad formed on the upper surface of the semiconductor chip 11 and the upper surface of the die pad 12 is shortened by the chip position regulating portion 12b, the length of the grounding wire 16B can be shortened. As a result, the parasitic inductance component of the grounding wire 16B is reduced, and therefore, the radio frequency characteristics of the semiconductor device are not deteriorated. It is noted that the height of the chip position regulating portion 12b of the die pad 12 is set at about 5% to about 100% of the thickness of the semiconductor chip 11 as measured from the mounting plane.

Moreover, the upper surface of the chip position regulating portion 12b is preferably at a substantially equal level to or at a lower level than that of the upper surface of the inner end of the second lead 15 adjacent thereto. In such a case, during encapsulating using a molding resin material, it is possible to prevent the wire 16A from coming into contact with the chip position regulating portion 12b of the die pad 12, which contact might otherwise be brought about depending upon the flow of the molding resin material. As a result, the reliability during the manufacturing process of the semiconductor device can be improved.

Furthermore, as shown in FIG. 2(a), the bottom of the inner end of each of the second leads 15 is located at a higher level than that of the thickness-reduced side portion 12a or the chip position regulating portion 12b of the die pad 12. Thus, during the molding process, it is possible to fill a sufficient amount of molding resin material even into the regions under the respective bottoms of the second leads 15. Ordinarily, a sufficient amount of molding resin material is less likely to be filled into such regions because the molding resin 17 in such regions eventually has a small thickness. As a result, the second leads 15 are less likely to peel off the molding resin 17, and the strength of the semiconductor device can be retained. In this case, the grain diameter of the fillers contained in the molding resin material is preferably 100 $\mu$m or less such that the molding resin material of the molding resin 17 may be equally filled even into the regions under the respective bottoms of the second leads 15 with certainty.

It is noted that the chip position regulating portions 12b may be provided for both thickness-reduced side portions of the die pad 12 as shown in FIG. 2(b).

Embodiment 3

Hereinafter, the third embodiment of the present invention will be described with reference to the drawings.

Figure 3A:
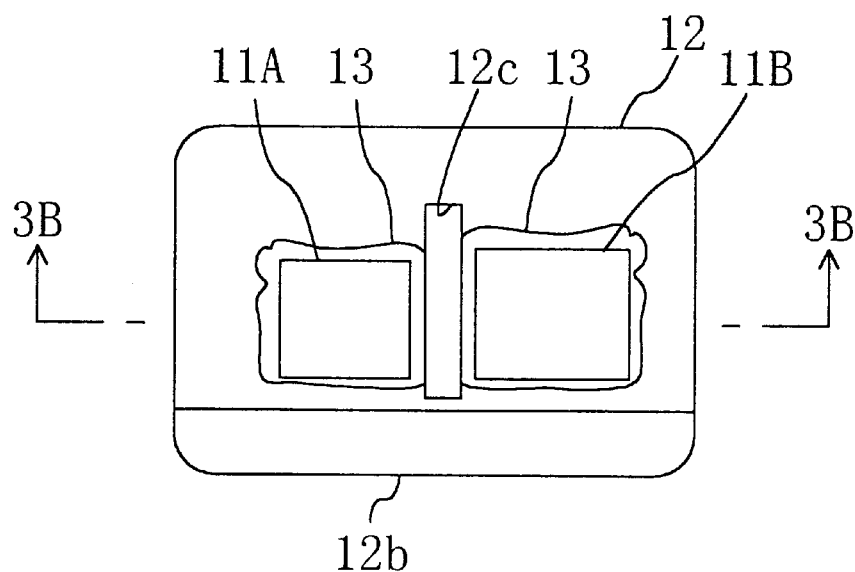
FIGS. 3(a) and 3(b) illustrate a semiconductor device in the third embodiment of the present invention.
Figure 3B:
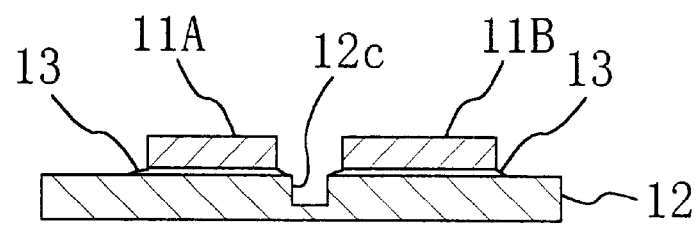

FIGS. 3(a) and 3(b) illustrate a semiconductor device in the third embodiment of the present invention. FIG. 3(a) illustrates a planar structure of a die pad in the semiconductor device and FIG. 3(b) illustrates a cross-sectional structure thereof taken along the line 3B—3B of FIG. 3(a).

In FIGS. 3(a) and 3(b), the same components as those shown in FIG. 2(a) are identified by the same reference numerals and the description thereof will be omitted herein. As shown in FIG. 3(a), an adhesive diffusion stopper portion 12c, having a square planar shape, extending vertically to the longer sides of the die pad 12 and forming a concave portion with respect to the mounting plane, is formed at the center of the mounting plane of the die pad 12. First and second semiconductor chips 11A and 11B are adhered to the die pad 12 with an adhesive 13 such as silver paste so as to sandwich the adhesive diffusion stopper portion 12c therebetween.

As can be understood, even in the case of mounting a plurality of semiconductor chips 11A and 11B on a single die pad 12, it is possible to prevent the adhesive 13 from diffusing over the mounting plane, because the adhesive diffusion stopper portion 12c having a square planar shape and a concave cross-sectional shape is provided between the adjacent semiconductor chips 11A and 11B. Since the adhesive 13 does not diffuse over the mounting plane, the mounting margin on the mounting plane of the die pad 12 can be reduced in mounting the respective semiconductor chips 11A and 11B on the mounting plane. Thus, a plurality of semiconductor chips 11A and 11B can be mounted to be even closer to each other. Accordingly, in electrically connecting the semiconductor chips 11A and 11B to each other via wires, the length of the wires can be shortened. As a result, the resistance and parasitic inductance of the wires can be reduced. If the integrated circuit formed in each of the semiconductor chips 11A and 11B is a radio frequency circuit, then the radio frequency circuit can be operated stably over a wide frequency region ranging from a DC region to a radio frequency region. It is noted that in order to attain a predetermined strength, the depth of the adhesive diffusion stopper portion 12c is preferably 95% or less of the thickness of the die pad 12.

In addition, if the adhesive diffusion stopper portion 12c is formed by etching away the predetermined region of the mounting plane of the die pad 12 during the formation of the die pad 12 through etching, an additional manufacturing process step is not necessary.

Embodiment 4

Hereinafter, the fourth embodiment of the present invention will be described with reference to the drawings.

Figure 4A:
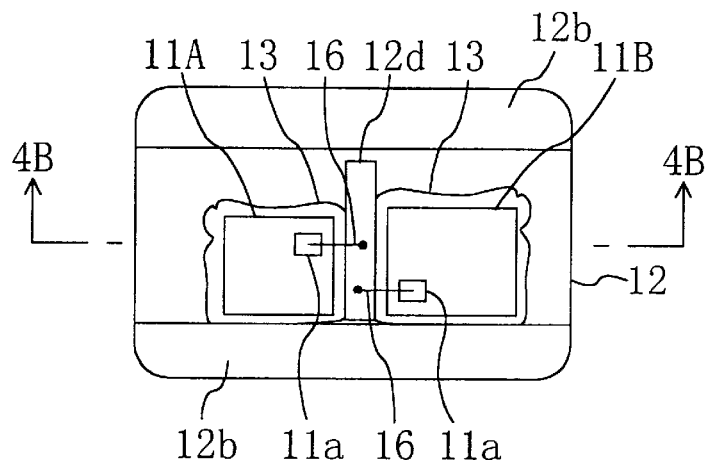
FIGS. 4(a) and 4(b) illustrate a semiconductor device in the fourth embodiment of the present invention.
Figure 4B:
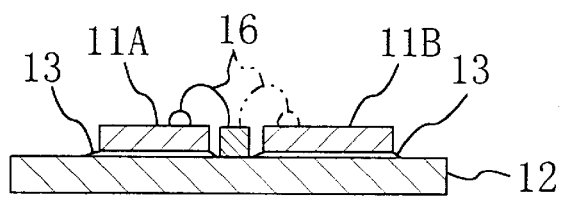

FIGS. 4(a) and 4(b) illustrate a semiconductor device in the fourth embodiment of the present invention. FIG. 4(a) illustrates a planar structure of the die pad; and FIG. 4(b) illustrates a cross-sectional structure of -the device taken along the line 4B—4B of FIG. 4(a). In FIGS. 4(a) and 4(b), the same components as those shown in FIG. 3(a) are identified by the same reference numerals and the description thereof will be omitted herein. As shown in FIG. 4(a), an adhesive diffusion stopper portion 12d, being made of a conductor, having a square planar shape, extending vertically to the longer sides of the die pad 12 and protruding with respect to the mounting plane, is formed at the center of the mounting plane of the die pad 12. First and second semiconductor chips 11A and 11B are adhered to the die pad 12 with an adhesive 13 such as silver paste so as to sandwich the adhesive diffusion stopper portion 12d therebetween.

In this embodiment, in the case of mounting a plurality of semiconductor chips 11A and 11B on a single die pad 12, it is possible to prevent the adhesive 13 from diffusing over the mounting plane, because the adhesive diffusion stopper portion 12d having a square planar shape and a square cross-sectional shape is provided between the semiconductor chips 11A and 11B, which are adjacent to each other. Thus, the mounting margin can be reduced in mounting the respective semiconductor chips 11A and 11B. Accordingly, a plurality of semiconductor chips 11A and 11B can be mounted to be even closer to each other. As a result, the length of the wires for wire bonding can be shortened. It is noted that the height of the adhesive diffusion stopper portion 12d as measured from the mounting plane is preferably about 5% to about 100% of the thickness of the die pad 12.

In such a case, the diffusion of the adhesive 13 can be prevented. In addition, if the bonding pads 11a on the semiconductor chips 11A and 11B are connected to the upper surface of the adhesive diffusion stopper portion 12d in electrically connecting the respective semiconductor chips 11A and 11B to the die pad 12 via the wires 16, the length of the wires 16 can be further shortened. As a result, the parasitic inductance of the wires 16 can be further reduced.

Furthermore, since the adhesive diffusion stopper portion 12d protrudes from the mounting plane of the die pad 12, the mounting margin on the mounting plane can be reduced. Thus, the positions on the mounting plane of the die pad 12, at which the semiconductor chips 11A and 11B are mounted, can be advantageously regulated at optimum positions.

Variation of Embodiment 4

Hereinafter, a variation of the fourth embodiment of the present invention will be described with reference to the drawings.

Figure 4C:
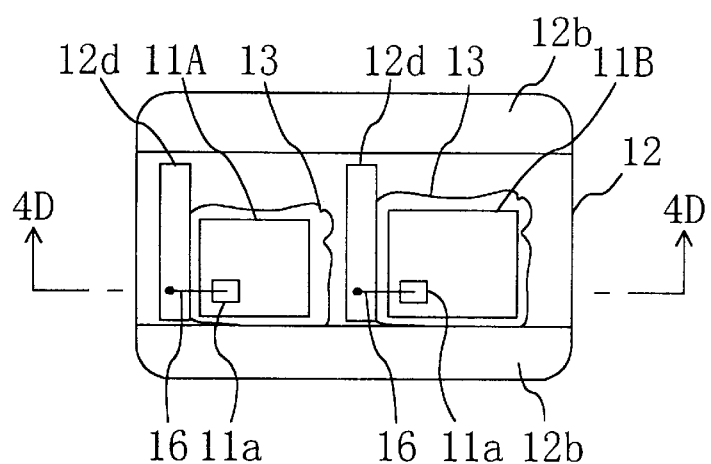
FIGS. 4(c) and 4(d) illustrate a semiconductor device in a variation of the fourth embodiment of the present invention.
Figure 4D:
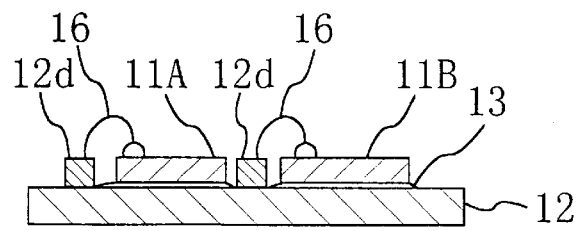

FIG. 4(c) illustrates a planar structure of a die pad in the semiconductor device of this variation and FIG. 4(d) illustrates a cross-sectional structure thereof taken along the line 4D—4D of FIG. 4(c). In FIGS. 4(c) and 4(d), the same components as those shown in FIG. 4(a) are identified by the same reference numerals and the description thereof will be omitted herein. As shown in FIG. 4(c), the same number of adhesive diffusion stopper portions 12d as the number of semiconductor chips are formed on the mounting plane of the die pad 12. Each of the adhesive diffusion stopper portions 12d is made of a conductor, has a square planar shape, extends vertically to the longer sides of the die pad 12 and protrudes with respect to the mounting plane. In this configuration, the mounting positions on the mounting plane can be regulated for the respective semiconductor chips.

Furthermore, the respective adhesive diffusion stopper portions 12d have conductivity. Thus, if the bonding pad formed on the upper surface of each semiconductor chip is connected to an associated adhesive diffusion stopper portion 12d closest to the bonding pad via a wire 16, then the wiring flexibility can be increased. That is to say, the length of each wire 16 can be further reduced.

Embodiment 5

Hereinafter, the fifth embodiment of the present invention will be described with reference to the drawings.

Figure 5A:
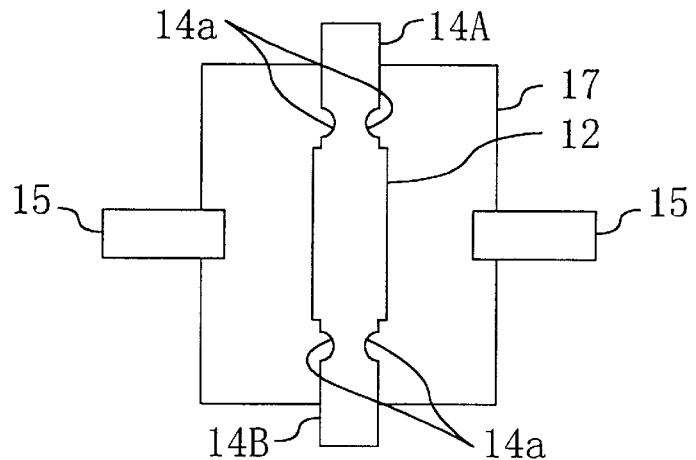
FIGS. 5(a) through 5(c) are bottom views illustrating a semiconductor device in the fifth embodiment of the present invention.
Figure 5B:
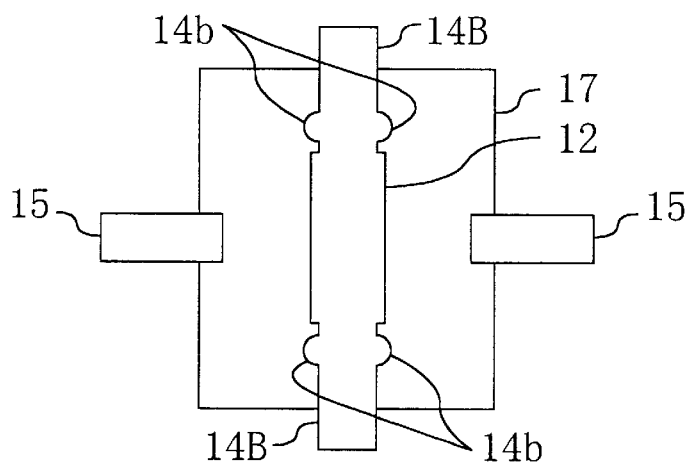
Figure 5C:
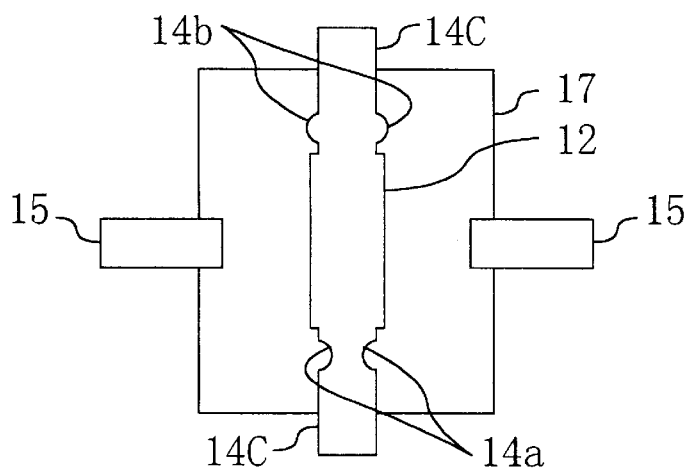

FIGS. 5(a) through 5(c) illustrate respective planar structures of various types of bottoms of the semiconductor device in the fifth embodiment of the present invention to be mounted on a substrate or the like. In FIG. 5(a), the same components as those shown in FIG. 1(c) are identified by the same reference numerals and the description thereof will be omitted herein. As shown in FIG. 5(a), each first lead 14A integrally connected to the die pad 12 includes concave portions 14a on right and left sides of the end adjacent to the die pad 12. Thus, the first lead 14A is even less likely to peel off the die pad 12.

Moreover, if the size of the concave portions 14A is changed, then the concave portions 14A can be used as indices for defining reference pins among lead pins. As a result, the process step of providing such indices for the molding resin 17 can be simplified.

On the other hand, as shown in FIG. 5(b), if convex portions 14b protruding substantially in parallel to the mounting plane are provided for first leads 14B, instead of the concave portions 14a of the first leads 14A, the same effects can be attained.

Furthermore, as shown in FIG. 5(c), if the convex portions 14b are provided for one of the first leads 14C and the concave portions 14a are provided for the other first lead 14C, then these portions are not symmetrical to the center of the mounting plane of the molding resin 17. Thus, in the case of using the concave portions 14a and the convex portions 14b, these portions 14a and 14b can be used as indices for reference pins easily and with certainty.

Embodiment 6

Hereinafter, the sixth embodiment of the present invention will be described with reference to the drawings.

Figure 6A:
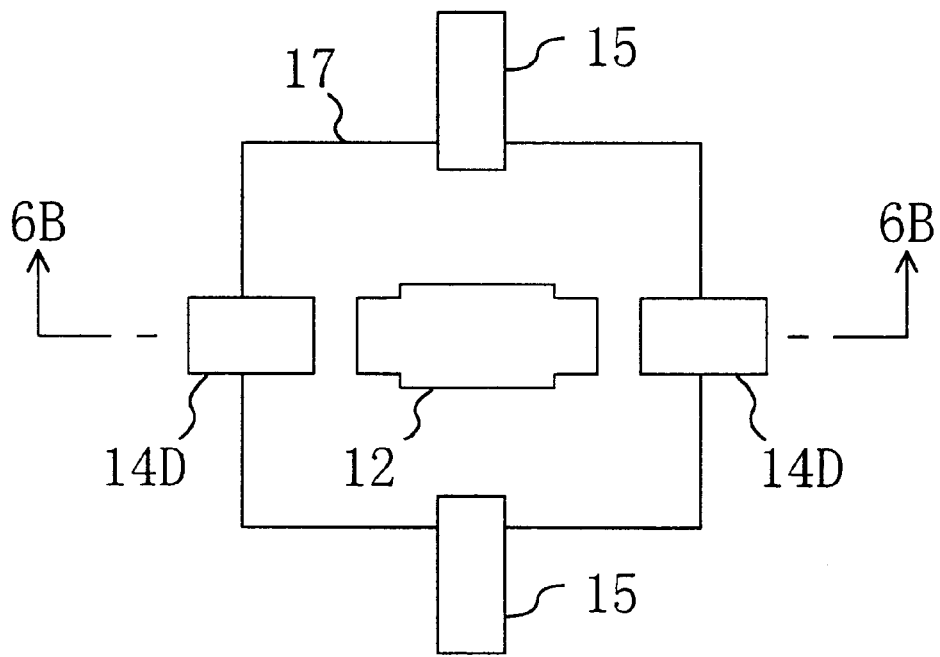
FIGS. 6(a) and 6(b) illustrate a semiconductor device in the sixth embodiment of the present invention.
Figure 6B:
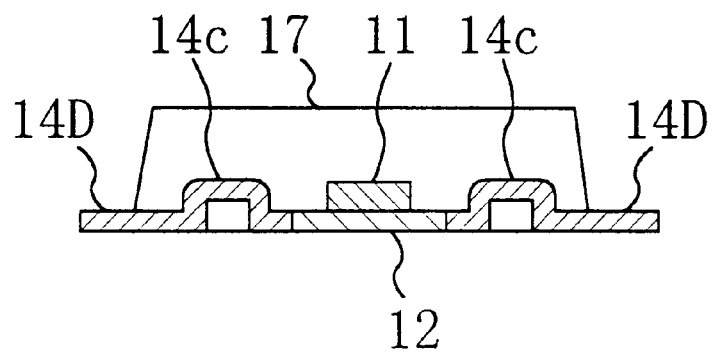

FIGS. 6(a) and 6(b) illustrate a semiconductor device in the sixth embodiment of the present invention. FIG. 6(a) illustrates a planar structure of the bottom thereof, i.e., the surface to be mounted on a substrate or the like, and FIG. 6(b) illustrates a cross-sectional structure thereof taken along the line 6B—6B of FIG. 6(a). In FIGS. 6(a) and 6(b), the same components as those shown in FIG. 1(c) are identified by the same reference numerals and the description thereof will be omitted herein. As shown in FIG. 6(b), each first lead 14D connected to the die pad 12 includes a curved portion 14c curving from the bottom toward the upper surface at the end adjacent to the die pad 12.

In this embodiment, as shown in FIG. 6(a), since the curved portion 14c is formed in each first lead 14D, the molding resin material is filled in the curved portion 14c during encapsulating the semiconductor chip 11 and the die pad 12 with the molding resin material. Thus, since the molding resin material filled in the curved portion 14c is integrated with the molding resin material located the outside of the curved portion 14c, the die pad 12 and the first leads 14D are even less likely to peel off the molding resin 17.

In addition, since the first lead 14D includes the curved portion 14c formed by bending, the strength of the first lead 14D is increased. Thus, even if the molding resin 17 is further downsized, the strength of the molding resin 17 can be retained.

Embodiment 7

Hereinafter, the seventh embodiment of the present invention will be described with reference to the drawings.

Figure 7:
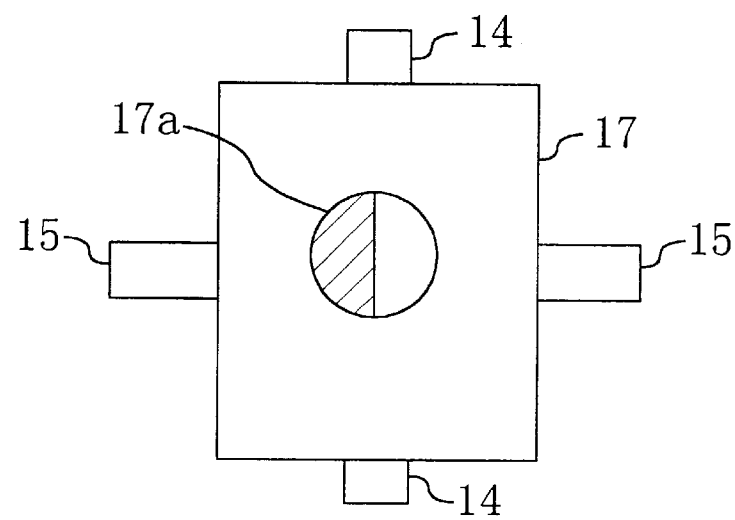
FIG. 7 is a plan view illustrating a semiconductor device in the seventh embodiment of the present invention.

FIG. 7 illustrates a planar structure of the upper surface of a semiconductor device in the seventh embodiment of the present invention. As shown in FIG. 7, an index 17a, having a concave cross section and including a mirror surface portion and a non-mirror surface portion at the bottom, is provided at the center of the upper surface of the molding resin 17 for integrally encapsulating the first and second leads 14, 15.

By using this index 17a, reference pins can be easily defined among the lead pins, and therefore the process of providing indices for the molding resin 17 can be simplified. The ratio of the non-mirror surface portion to the mirror surface portion in the index 17a may be in the range from about 1% to about 99%, preferably 50%.

Moreover, the index 17a may be a site to which the top of an ejecting pin for ejecting the molding resin 17 from a predetermined mold is inserted after the encapsulation has been performed. The index 17a may be formed at any place other than the upper surface of the molding resin 17.

Embodiment 8

Hereinafter, the eighth embodiment of the present invention will be described with reference to the drawings.

Figure 8:
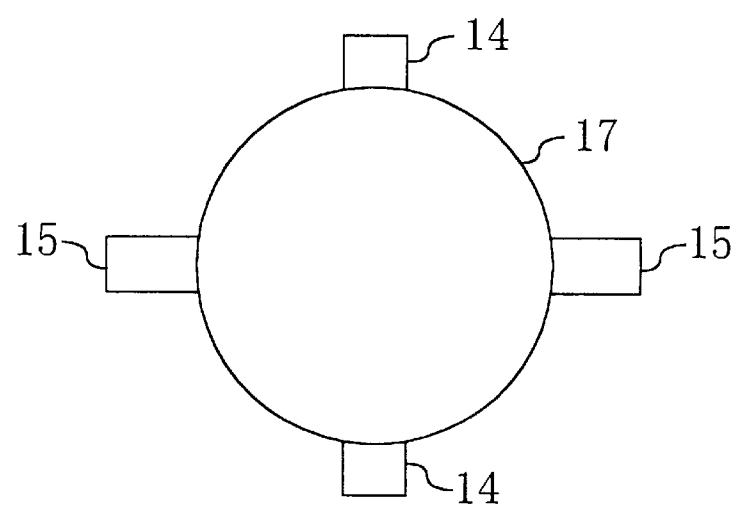
FIG. 8 is a plan view illustrating a semiconductor device in the eighth embodiment of the present invention.
Figure 9A:
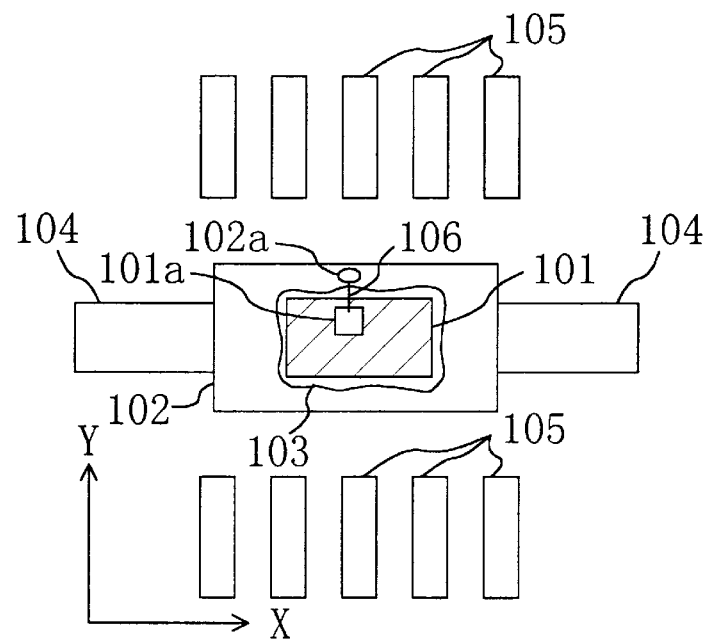
FIGS. 9(a) through 9(c) illustrate a conventional semiconductor device.
Figure 9B:
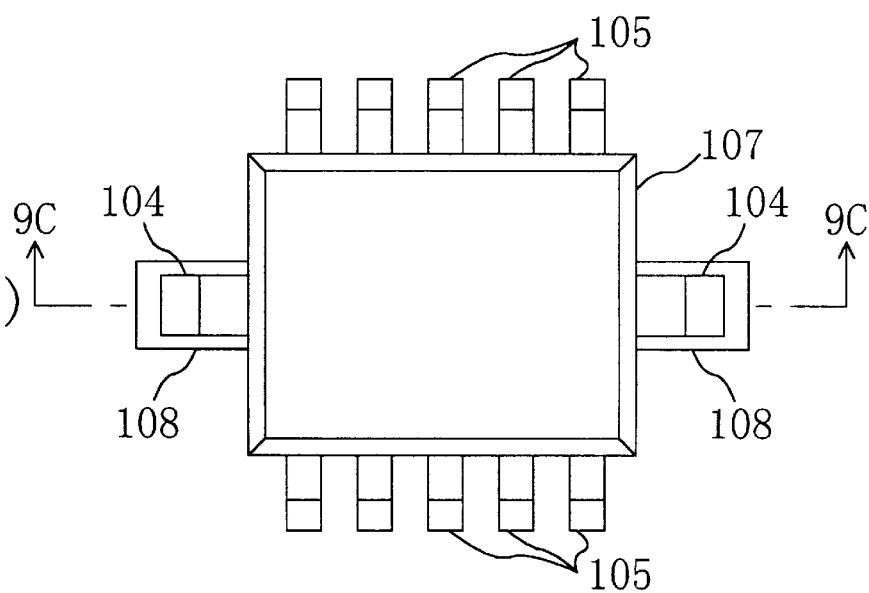
Figure 9C:
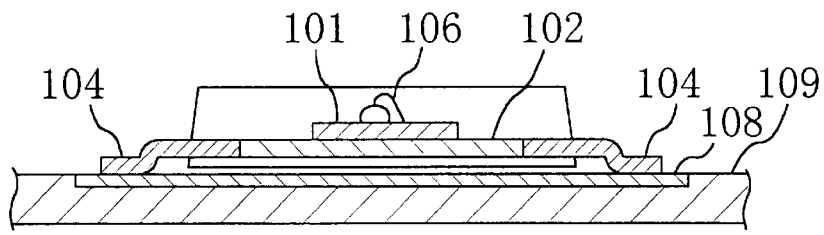

FIG. 8 illustrates a planar structure of the upper surface of a semiconductor device in the eighth embodiment of the present invention. As shown in FIG. 8, the molding resin 17, made of a molding resin material, for integrally encapsulating the first and second leads 14 and 15 has a rounded top surface. That is to say, since the four corners of a conventional molding resin 17 having a square top surface are removed, the required amount of molding resin material can be reduced. As a result, the area and weight of the mounting plane of the semiconductor device can be reduced.

What is claimed is:

1. A semiconductor device comprising:
  a die pad;
  a semiconductor element mounted on the die pad;
  a first lead having an inner end connected to the die pad;
  a second lead having an inner end electrically connected to the semiconductor element via a wire; and
  a molding resin integrally encapsulating the die pad, the semiconductor element, an inner portion of the first lead and an inner portion of the second lead,
  wherein:
    at least part of the bottom of the die pad is exposed on the bottom of the molding resin,
    at least part of the bottom of the first lead is exposed on the bottom of the molding resin,
    at least part of the bottom of the second lead is exposed on the bottom of the molding resin,
    the exposed part of the die pad is substantially flush with the exposed part of the second lead at a first level,
    the die pad includes a thickness-reduced side portion protruding substantially in parallel to a mounting plane of the die pad, the thickness-reduced side portion being covered with the molding resin,
    the inner portion of the second lead includes a bent portion for bending the inner end of the second lead in a direction from the bottom toward the upper surface of the second lead, and
    a distance between the first level and a bottom of the inner end of the second lead is equal to or larger than a distance between the first level and a bottom of each of the thickness-reduced side portions.

2. The semiconductor device of claim 1, wherein a thickness of the molding resin covering the upper surface of the inner end of the second lead is larger than a thickness of the molding resin covering the bottom of the inner end of the second lead.

3. The semiconductor device of claim 1, wherein the second lead includes at least two leads provided to be spaced apart from the sides of the die pad and to interpose the die pad therebetween,
  and wherein at least one of the two second leads includes, at the inner end, a width-increased end portion having a larger width than the width of the other portion.

4. The semiconductor device of claim 1, wherein the width of a mounting plane of the die pad is larger than the width of the bottom of the die pad.

5. The semiconductor device of claim 1, wherein the upper surface of the semiconductor element is located at substantially the same level as the level of the upper surface of the inner end of the second lead when the levels are measured from the bottom of the molding resin.

6. The semiconductor device of claim 1, wherein the first lead includes a pair of leads extending from one end and the other end of the die pad, respectively,
  and wherein the second lead includes at least two leads provided to be spaced apart from the sides of the die pad and to interpose the die pad therebetween.

7. The semiconductor device of claim 1, wherein the die pad includes a convex portion on the periphery of a mounting plane, the convex portion protruding substantially vertically to the mounting plane.

8. The semiconductor device of claim 7, wherein the upper surface of the convex portion of the die pad is located at substantially the same level as the level of the upper surface of the semiconductor element when the levels are measured from the bottom of the molding resin.

9. The semiconductor device of claim 7, wherein the upper surface of the convex portion of the die pad is located at substantially the same level as the level of the upper surface of the inner end of the second lead when the levels are measured from the bottom of the molding resin.

10. The semiconductor device of claim 1, wherein at least two semiconductor elements are mounted on the die pad,
  and wherein a concave portion or a convex portion is provided for a mounting plane of the die pad between adjacent ones of the semiconductor elements.

11. The semiconductor device of claim 1, wherein the first lead includes concave side portions or convex side portions, and wherein the bottom of the first lead is entirely exposed on the bottom of the molding resin.

12. The semiconductor device of claim 11, wherein the concave portions or the convex portions are formed at respective positions asymmetrical with respect to the center of the bottom of the molding resin.

13. The semiconductor device of claim 1, wherein the inner portion of the first lead includes a curved portion curving from the bottom toward the upper surface of the inner portion of the first lead, and wherein a molding resin material is filled inside the curved portion.

14. The semiconductor device of claim 1, wherein the molding resin includes a concave portion, the bottom of the concave portion being divided into a mirror surface portion and a non-mirror surface portion so as to correspond to the first lead and the second lead.

15. A semiconductor device comprising:

a die pad;

a semiconductor element mounted on the die pad;

a first lead connected to the die pad; and a second lead provided so as to be spaced apart from the side of the die pad, wherein:

the die pad and the first and second leads are integrally encapsulated with a molding resin material such that the bottoms of the die pad and the first and second leads are flush with each other at least partially, the die pad includes an expanding side portion on the upper surface of the die pad, the expanding side portion expanding from the side of the die pad facing the second lead and being electrically connected to the semiconductor element via a grounding wire, the molding resin material is also filled into a region between the inner end of said second lead and said expanding side portion, a region underlying the inner end of said second lead and a region underlying said expanding side portion, the second lead includes a width-increased end portion at the inner end, the width-increased end portion extending along the side of the die pad and having a width larger than the length of the semiconductor element as measured along the second lead, and the width-increased end portion of the second lead and the semiconductor element are electrically connected to each other via at least two wires.

16. A lead frame for a semiconductor device, comprising;

a die pad;

a first lead having an inner end integrally formed with the die pad; and at least two second leads provided so as to interpose the die pad therebetween, the inner ends of the second leads being spaced apart from the die pad, wherein:

the die pad includes a thickness-reduced side portion expanding substantially in parallel to a mounting plane of the die pad on which a semiconductor element is mounted, an inner portion of each said second lead includes a bent portion bending the inner end of the second lead from the bottom toward the upper surface of the inner end, at least part of the bottom of the die pad is substantially flush with at least part of the bottom of each said second lead at a first level, and a distance between the first level and a bottom of the inner end of each of the second leads is equal to or larger than a distance between the first level and a bottom of the thickness-reduced side portion.

17. The semiconductor device of claim 1, wherein a top face of each of the thickness-reduced side portions and the semiconductor element are electrically connected to each other via a grounding wire.

18. The lead frame of claim 16, wherein at least one of the two second leads includes, at the inner end, a width-increased end portion having a larger width than the width of the other portion.

* * * * *